United States Patent
Aquilino et al.

(10) Patent No.: US 10,833,160 B1
(45) Date of Patent: Nov. 10, 2020

(54) FIELD-EFFECT TRANSISTORS WITH SELF-ALIGNED AND NON-SELF-ALIGNED CONTACT OPENINGS

(71) Applicant: GLOBALFOUNDRIES Inc., Grand Cayman (KY)

(72) Inventors: Michael Aquilino, Gansevoort, NY (US); Daniel Jaeger, Saratoga Springs, NY (US); Naved Siddiqui, Malta, NY (US); Jessica Dechene, Watervliet, NY (US); Daniel J. Dechene, Watervliet, NY (US); Shreesh Narasimha, Charlotte, NC (US); Natalia Borjemscaia, Greensboro, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/386,363

(22) Filed: Apr. 17, 2019

(51) Int. Cl.
| | |
|---|---|
| *H01L 21/768* | (2006.01) |
| *H01L 21/311* | (2006.01) |
| *H01L 21/82* | (2006.01) |
| *H01L 21/033* | (2006.01) |
| *H01L 21/027* | (2006.01) |
| *H01L 21/306* | (2006.01) |
| *H01L 29/417* | (2006.01) |
| *H01L 27/088* | (2006.01) |
| *H01L 29/40* | (2006.01) |

(52) U.S. Cl.
CPC .... *H01L 29/41775* (2013.01); *H01L 21/0337* (2013.01); *H01L 21/31144* (2013.01); *H01L 27/088* (2013.01); *H01L 29/401* (2013.01)

(58) Field of Classification Search
CPC .................................................. H01L 21/0337
See application file for complete search history.

(56) References Cited

U.S. PATENT DOCUMENTS

| | | | |
|---|---|---|---|
| 5,731,242 A | 3/1998 | Parat et al. | |
| 6,277,544 B1 * | 8/2001 | Singh | G03F 7/0035 430/313 |
| 6,287,951 B1 * | 9/2001 | Lucas | H01L 21/76801 257/E21.507 |
| 8,470,711 B2 | 6/2013 | Arnold et al. | |
| 9,548,366 B1 * | 1/2017 | Ho | H01L 21/823475 |
| 9,984,970 B1 | 5/2018 | Haigh | |
| 2015/0147882 A1 * | 5/2015 | Yao | H01L 21/76805 438/675 |
| 2018/0151735 A1 * | 5/2018 | Chu | H01L 21/02667 |
| 2018/0261510 A1 | 9/2018 | Qiu et al. | |

* cited by examiner

*Primary Examiner* — Omar F Mojaddedi
(74) *Attorney, Agent, or Firm* — Thompson Hine LLP; Anthony Canale

(57) ABSTRACT

Structures for a field-effect transistor and methods of forming a field-effect transistor. A sidewall spacer is arranged adjacent to a sidewall of a gate electrode, a source/drain region is arranged laterally adjacent to the sidewall spacer, and a contact is arranged over the source/drain region and laterally adjacent to the sidewall spacer. The contact is coupled with the source/drain region. A section of an interlayer dielectric layer is laterally arranged between the contact and the sidewall spacer.

9 Claims, 12 Drawing Sheets

FIELD-EFFECT TRANSISTORS WITH SELF-ALIGNED AND NON-SELF-ALIGNED CONTACT OPENINGS

BACKGROUND

The present invention relates to semiconductor device fabrication and integrated circuits and, more specifically, to structures for a field-effect transistor and methods of forming a field-effect transistor.

Device structures for a field-effect transistor generally include a body region, a source and a drain defined in the body region, and a gate electrode configured to switch carrier flow in a channel formed, during operation, in the body region. When a control voltage greater than a designated threshold voltage is applied to the gate electrode, carrier flow occurs in the channel between the source and drain to produce a device output current.

A self-aligned etching process may be used when forming contacts coupled with the source and drain of the field-effect transistor. The etching process removes dielectric material from locations over the semiconductor material constituting the source and drain. In a structure that includes both long-channel field-effect transistors and short channel field-effect transistors, the margin for shorting between the gate electrode and the source and drain contacts may be reduced by the removal of the dielectric material to expose the source and drain for contact formation.

Improved structures for a field-effect transistor and methods of forming a field-effect transistor are needed.

SUMMARY

In an embodiment, a structure includes a gate electrode, a sidewall spacer adjacent to a sidewall of the gate electrode, a source/drain region laterally adjacent to the sidewall spacer, and a contact arranged over the source/drain region. The contact, which is also arranged laterally adjacent to the sidewall spacer, is coupled with the source/drain region. The structure further includes an interlayer dielectric layer having a section laterally arranged between the contact and the sidewall spacer.

In an embodiment, a method includes forming a first section of an interlayer dielectric layer over a first source/drain region of a first field-effect transistor, and forming a second section of the interlayer dielectric layer over a second source/drain region of a second field effect transistor. The method further includes etching the first and second sections of the interlayer dielectric layer with an etching process that patterns the first section of the interlayer dielectric layer and that fully removes the second section of the interlayer dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
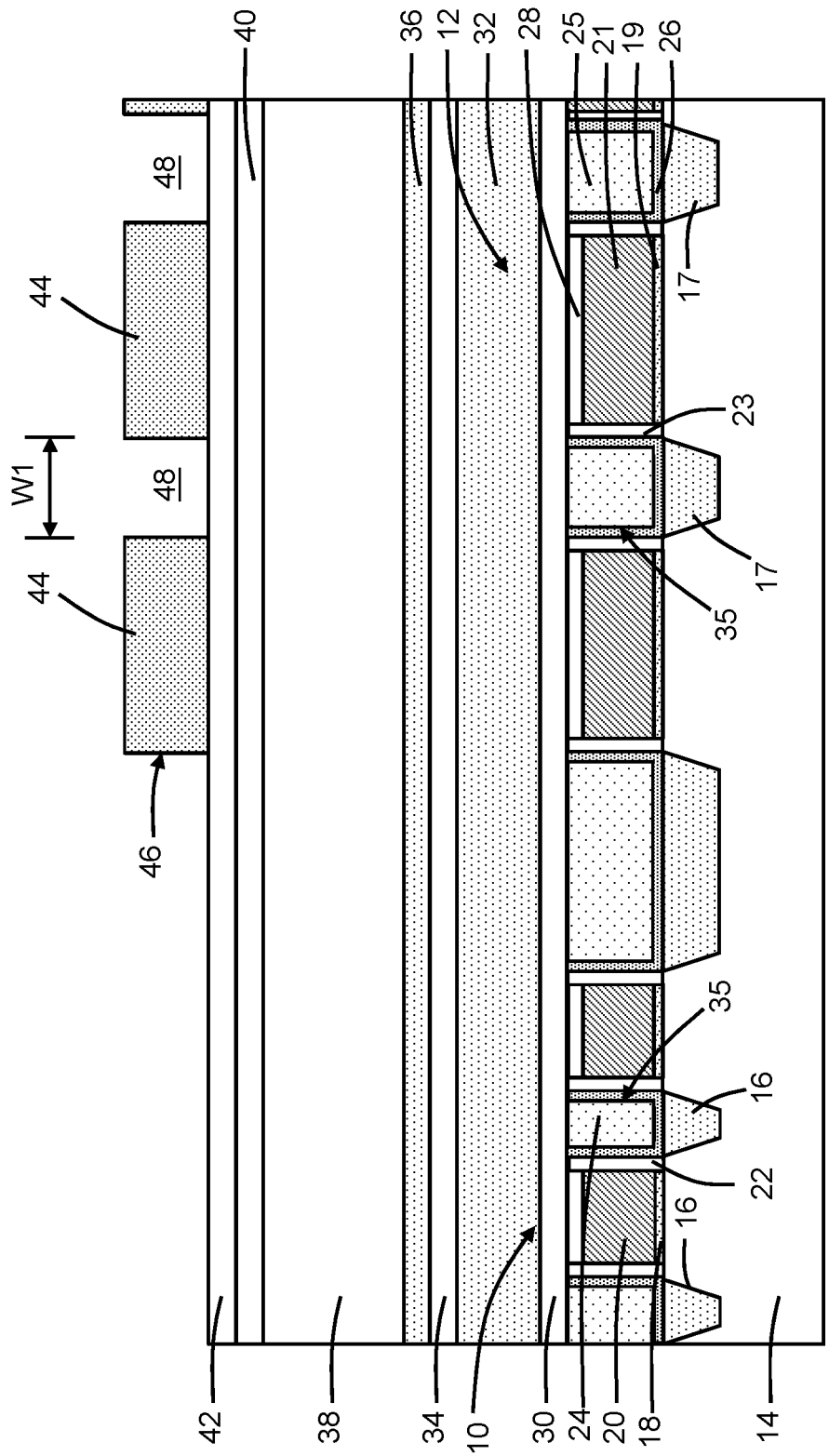
FIGS. 1-10 are cross-sectional views of a device structure at successive fabrication stages of a processing method in accordance with embodiments of the invention.

With reference to FIG. 1 and in accordance with embodiments of the invention, field-effect transistors 10, 12 may be fabricated using a semiconductor layer or body 14 by complementary-metal-oxide-semiconductor (CMOS) processes during front-end-of-line (FEOL) processing. The semiconductor body 14 may be a semiconductor fin composed of a single-crystal semiconductor material, may be a bulk semiconductor wafer composed of a single-crystal semiconductor material, or may be a silicon-on-insulator wafer with a device layer composed of a single-crystal semiconductor material. The single-crystal semiconductor material of the semiconductor body 14 may be single-crystal silicon. In an embodiment, the field-effect transistor 10 may be a short-channel device structure, and the field-effect transistor 12 may be a long-channel device structure. Short-channel devices, such as the field-effect transistor 10, have a smaller channel length-to-channel width ratio than the channel length-to-channel width ratio of long-channel devices, such as the field-effect transistor 12, due primarily to differences in channel length. For example, the channel length of a long-channel device may be selected to be significantly greater than a sum of the drain and source depletion widths, and the channel length of a short-channel device may be comparable to the depletion widths associated with the drain and source. A diffusion break may be provided between a region including the field-effect transistor 10 and a region including the field-effect transistor 12 to provide electric isolation.

The field-effect transistor 10 includes source/drain regions 16, a gate dielectric 18, and a gate electrode 20 that is separated from the semiconductor body 14 by the gate dielectric 18. Similarly, the field-effect transistor 12 includes source/drain regions 17, a gate dielectric 19, and a gate electrode 21 that is separated from the semiconductor body 14 by the gate dielectric 19. The gate dielectrics 18, 19 may be composed of one or more dielectric or insulating materials, such as silicon dioxide formed by oxidation or hafnium oxide deposited by atomic layer deposition. The gate electrodes 20, 21 may be composed of a conductor, such as doped polysilicon or one or more work function metals, deposited by chemical vapor deposition and/or atomic layer deposition. Sidewall spacers 22, 23 composed of a dielectric material, such as silicon nitride, may be provided adjacent to the sidewalls of the gate electrodes 20, 21. The sidewall spacers 22, 23 may be formed by depositing a conformal layer of the dielectric material with atomic layer deposition and anisotropically etching the deposited conformal layer. Gate caps 28, which may be composed of silicon nitride, are positioned over the gate electrodes 20, 21.

The source/drain regions 16 are laterally arranged on opposite sides of the gate electrode 20, and the source/drain regions 17 are laterally arranged on opposite sides of the gate electrode 21. As used herein, the term "source/drain region" means a doped region of semiconductor material that can function as either a source or a drain of a field-effect transistor. The source/drain regions 16, 17 may be provided by the epitaxial growth of a semiconductor material following the formation of the gate electrodes 20, 21. The source/drain regions 16, 17 may contain an n-type dopant (e.g., phosphorus and/or arsenic) that provides n-type conductivity. Alternatively, the source/drain regions 16, 17 may contain a p-type dopant (e.g., boron) that provides p-type conductivity.

Sections 24 of an interlayer dielectric layer 35 are formed over the source/drain regions 16, and sections 25 of an interlayer dielectric layer 35 are formed over the source/drain regions 17. The sections 24, 25 of the interlayer dielectric layer 35 may be composed of a dielectric material, such as an oxide of silicon (e.g., silicon dioxide), that is deposited by chemical vapor deposition and planarized. Prior to depositing the interlayer dielectric layer 35, a contact etch-stop layer (CESL) 26 may be formed that provides a liner between the sections 24, 25 of the interlayer dielectric layer 35 and the source/drain regions 16, 17. The CESL 26 may be composed of a thin layer of a dielectric material, such as silicon nitride deposited by atomic layer deposition, characterized by etch selectivity relative to the dielectric material of the interlayer dielectric layer 35. The CESL 26 operates as an etch stop when the sections 24, 25 of the interlayer dielectric layer 35 are removed for contact formation.

A layer stack that includes a dielectric layer 30 and a sacrificial layer 32 is arranged over the field-effect transistors 10, 12 with the sacrificial layer 32 formed over the dielectric layer 30. The dielectric layer 30 may be composed of dielectric material, such as silicon dioxide, deposited by plasma-enhanced chemical vapor deposition using ozone and tetraethylorthosilicate (TEOS) as reactants, and the sacrificial layer 32 may be composed of amorphous carbon, or another inorganic material, deposited by plasma-enhanced chemical vapor deposition. The sacrificial layer 32 may have a thickness in a range of 50 nanometers to 150 nanometers. The layer stack may further include a dielectric layer 34 that is formed over the sacrificial layer 32 and another sacrificial layer 36 that is formed over the dielectric layer 34. The dielectric layer 34 may be composed of silicon carbon nitride (SiCN) deposited by chemical vapor deposition, and the sacrificial layer 36 may be composed of amorphous silicon, or another inorganic material, deposited by chemical vapor deposition. The dielectric layer 34 may function as an adhesion promoter between the sacrificial layer 32 and the sacrificial layer 36.

Figure 1A:
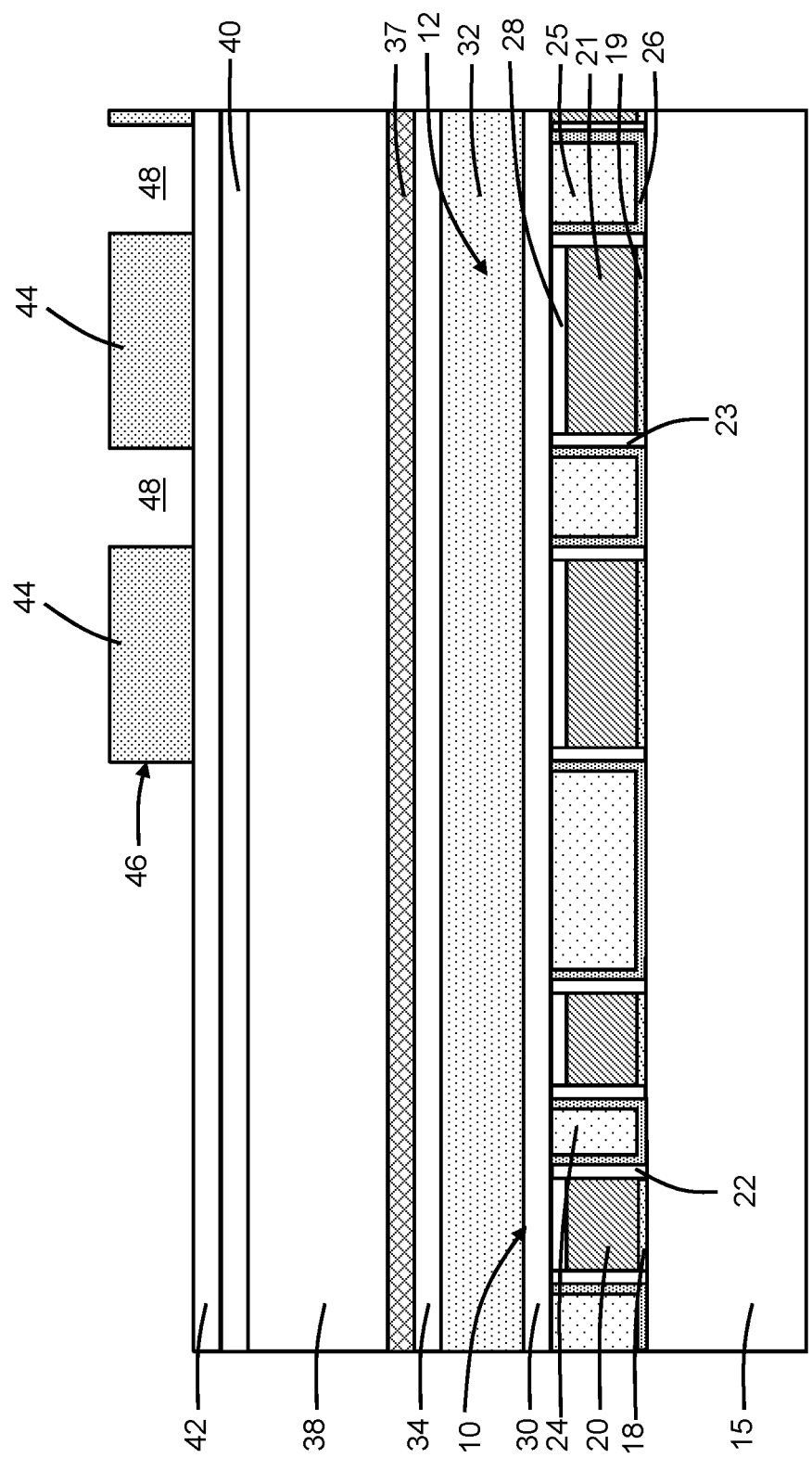
FIG. 1A is a cross-sectional view similar to FIG. 1 that is taken at a different location along the length of the gate structures and that illustrates the integration of tone inversion during fabrication stages of the processing method preceding the fabrication stage of FIG. 1.

The layer stack including the sacrificial layers 32, 36 may be product of a process flow that relies on multiple lithography-etch processes and tone inversion. As shown in FIG. 1A, a section of a dielectric layer 37 may be arranged adjacent to the sacrificial layer 36 over a portion of the underlying layer stack and, in particular, may be arranged over the dielectric layer 34 laterally adjacent to the section of the sacrificial layer 36. The section of the dielectric layer 37 may subsequently provide a cut mask for removing underlying sections of the gate electrodes 20, 21. To that end, the sacrificial layer 36 may be patterned with lithography and etching processes to form a trench at a selected cut location. The dielectric layer 37 is deposited to fill the trench in the sacrificial layer 36, and planarized such that the section of the dielectric layer 37 is substantially coplanar with the sacrificial layer 36. The section of the dielectric layer 37 provides an image reversal material that defines a pattern complementary to the pattern formed in the sacrificial layer 36. Over an area beneath the dielectric layer 37, the gate electrodes 20, 21 may be arranged over trench isolation 15 that is formed to surround the semiconductor body 14.

A spin-on hardmask layer 38, a dielectric layer 40, and an anti-reflective coating 42 are arranged as components of a lithography stack formed over the layer stack with the spin-on hardmask layer 38 disposed directly on the upper sacrificial layer 36 and the dielectric layer 37. Resist shapes 44 of an etch mask 46 may be formed by lithography over the lithography stack. The etch mask 46 may include a layer of a light-sensitive material, such as an organic photoresist, applied by a spin coating process, pre-baked, exposed to light projected through a photomask, baked after exposure, and developed with a chemical developer to form the resist shapes 44. Each of the resist shapes 44 covers an area of nominally equal dimensions on the top surface of the lithography stack.

The individual resist shapes 44 of the etch mask 46 are separated by respective openings 48. The openings 48 have a given width dimension, W1, and the resist shapes 44 may be arranged to provide the openings 48 with a given pitch. The openings 48 are arranged over the field-effect transistor 12 and, in particular, are arranged directly over the sections 25 of the interlayer dielectric layer 35 that are arranged above the source/drain regions 17 of the field-effect transistor 12. The etch mask 46 is fully removed during lithography from the region over the field-effect transistor 10.

Figure 2:
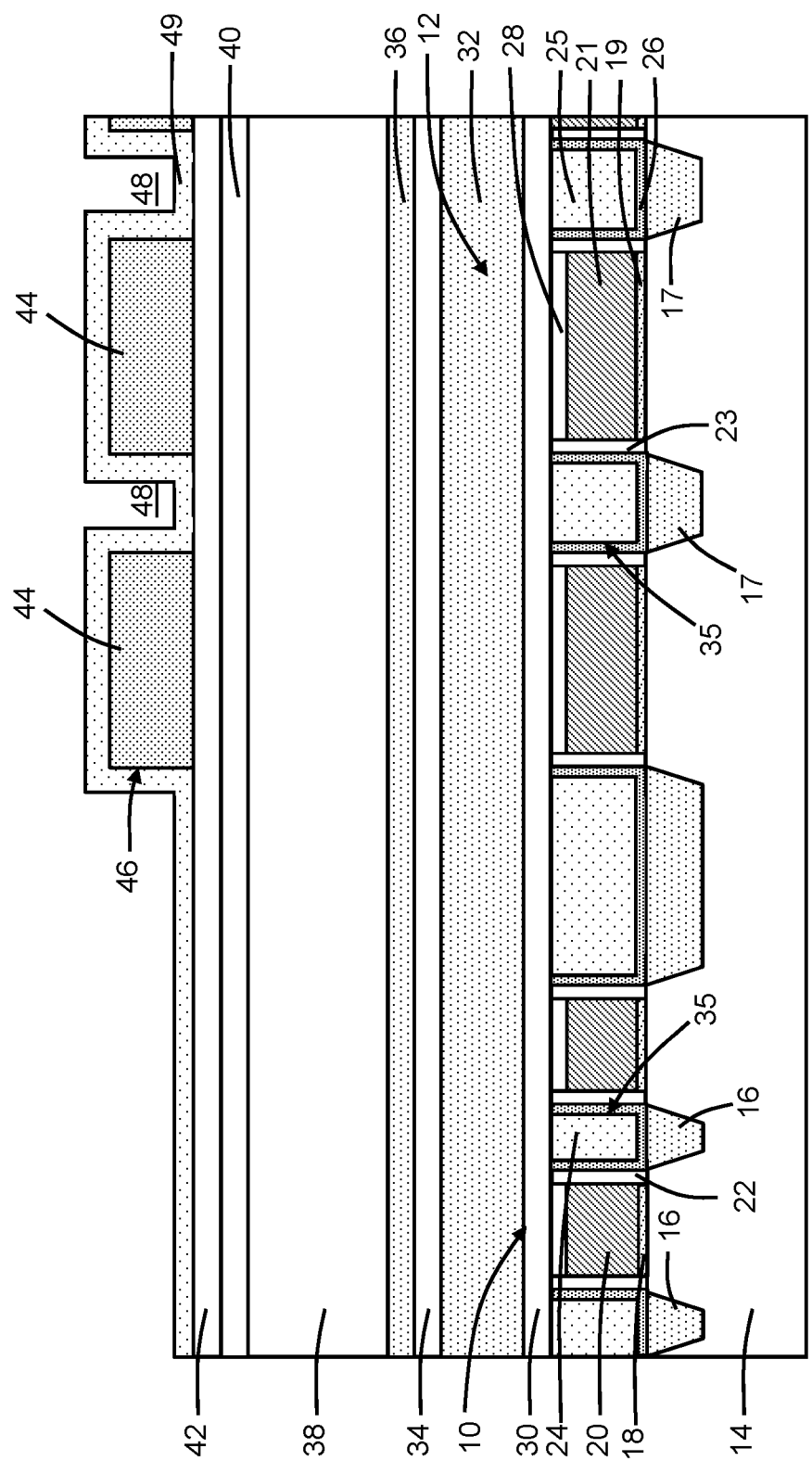

With reference to FIG. 2 in which like reference numerals refer to like features in FIG. 1 and at a subsequent fabrication stage, a conformal layer 49 is deposited by a deposition technique, such as atomic layer deposition. The conformal layer 49 deposits with a uniform thickness on the sidewalls of the resist shapes 44 to narrow the openings 48. However, the deposition is controlled to avoid pinching off and closing the openings 48. The conformal layer 49 may be composed of a dielectric material, such as silicon dioxide. The conformal layer 49 also covers the top surface of the lithography stack over areas that are not covered by the resist shapes 44, including the portion of the top surface between the resist shapes 44.

Figure 3:
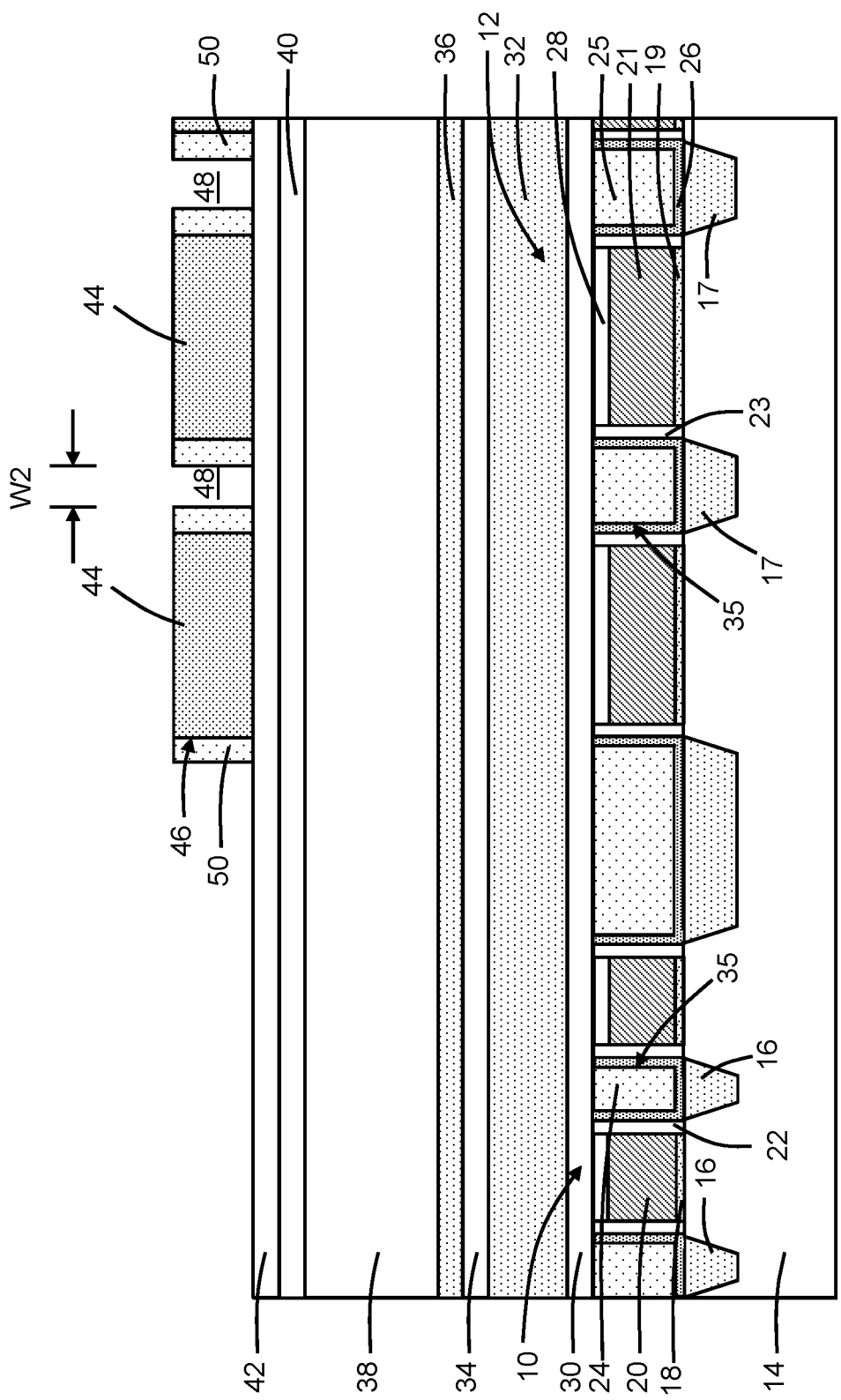

With reference to FIG. 3 in which like reference numerals refer to like features in FIG. 2 and at a subsequent fabrication stage, sidewall spacers 50 are formed from the conformal layer 49 by etching the deposited conformal layer 49 with an anisotropic etching process, such as reactive ion etching, that removes the material of the conformal layer 49 selective to the material of the anti-reflective coating 42. The sidewall spacers 50 are arranged adjacent to the sidewalls of the resist shapes 44 of the etch mask 46. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

The resist shapes 44 function as sacrificial mandrels for the deposition of the conformal layer 49 and the subsequent formation of the sidewall spacers 50. The formation of the sidewall spacers 50 decreases the area of the lithography stack exposed between the resist shapes 44 by narrowing the openings 48 such that the width dimension, W2, is less than the width dimension, W1 (FIG. 1). In an embodiment, the width dimension, W2, following formation of the sidewall spacers 50 may be approximately 10 nanometers to approximately 12 nanometers. The conformal layer 49 is completely removed by the etching process from the region over the field-effect transistor 10.

Figure 4:
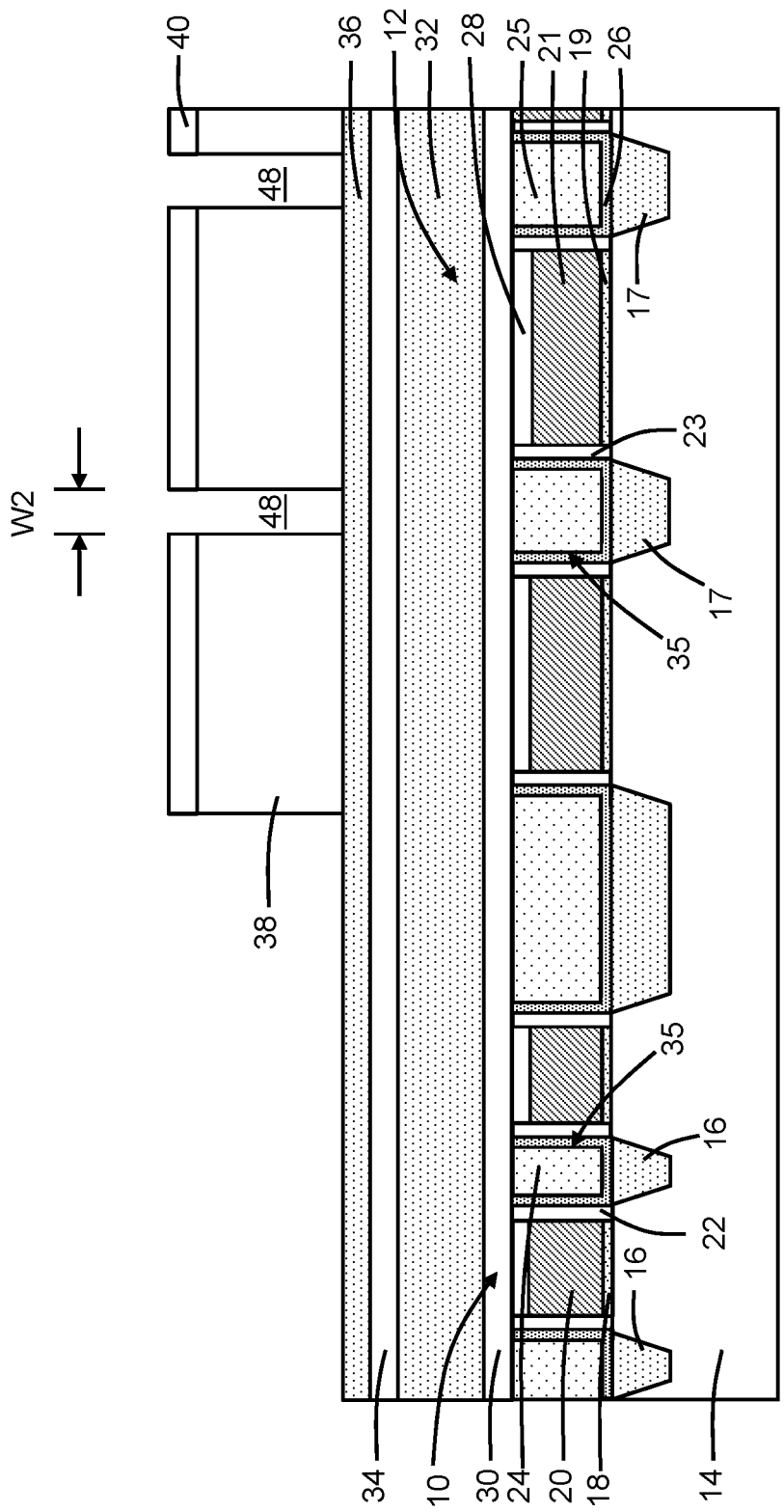

With reference to FIG. 4 in which like reference numerals refer to like features in FIG. 3 and at a subsequent fabrication stage, the pattern of openings 48 provided by the resist shapes 44 of the etch mask 46 and the sidewall spacers 50 is transferred to the anti-reflective coating 42 and dielectric layer 40 with an etching process, such as reactive ion etching. The openings 48 are subsequently transferred from the dielectric layer 40 to the spin-on hardmask layer 38 with an etching process, such as a reactive ion etching process, after removing the etch mask 46 and anti-reflective coating 42. The etching process may be selected to stop, after penetrating fully through the spin-on hardmask layer 38, on the material of the upper sacrificial layer 36. The resist shapes 44 of the etch mask 46 and the sidewall spacers 50 collectively mask the remaining portions of the spin-on hardmask layer 38 following the conclusion of the etching process. The etch mask 46 and sidewall spacers 50 may be removed after patterning the spin-on hardmask layer 38. The patterned spin-on hardmask layer 38 includes sections that are separated by the openings 48, which nominally have the width, W2.

Figure 5:
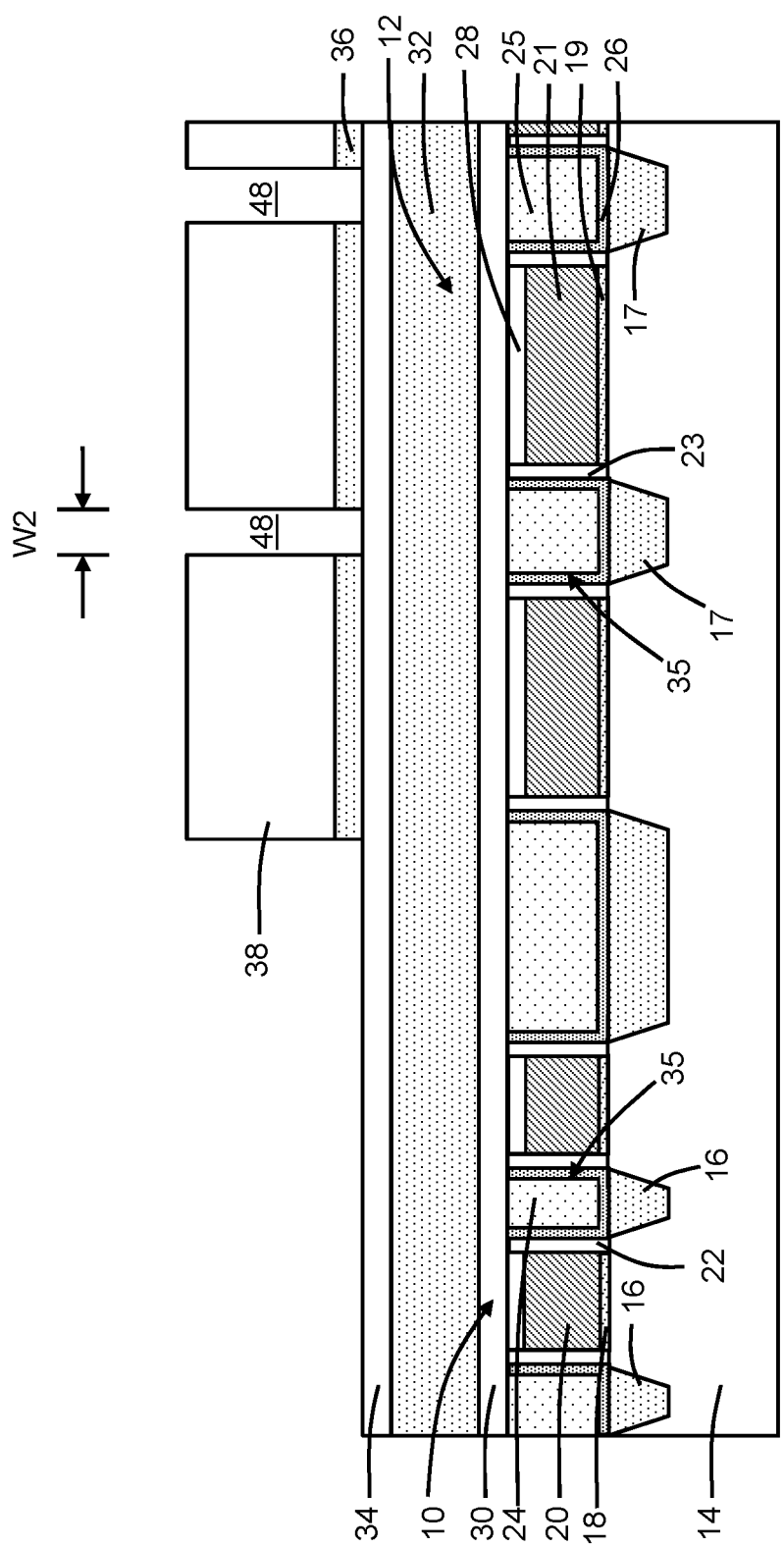

With reference to FIG. 5 in which like reference numerals refer to like features in FIG. 4 and at a subsequent fabrication stage, the pattern of openings 48 is transferred from the spin-on hardmask layer 38 to the upper sacrificial layer 36 with an etching process, such as a reactive ion etching process. The etching process patterning the upper sacrificial layer 36 may remove the dielectric layer 40. Following patterning, the upper sacrificial layer 36 includes individual sections that are respectively separated by the transferred openings 48, which nominally have the width, W2. The spin-on hardmask layer 38 may be removed after the upper sacrificial layer 36 is patterned.

Figure 6:
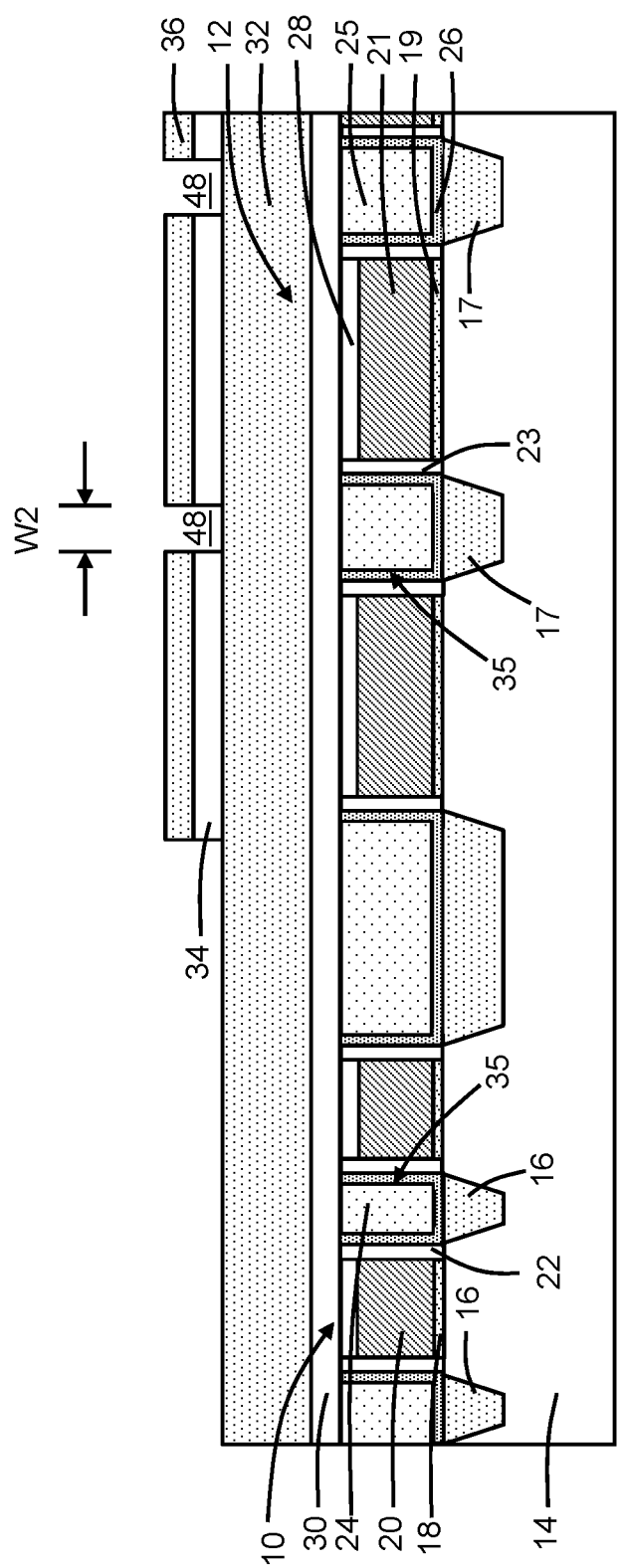

With reference to FIG. 6 in which like reference numerals refer to like features in FIG. 5 and at a subsequent fabrication stage, the dielectric layer 34 is patterned with an etching process, such as reactive ion etching, to transfer the openings 48 from the upper sacrificial layer 36 to the dielectric layer 34. The dielectric layer 34 includes sections that are separated by the openings 48, which nominally have the width, W2. After the dielectric layer 34 is patterned, the sections of the upper sacrificial layer 36 may be removed with an etching process that removes its material selective to the material constituting the dielectric layer 37 (FIG. 1A).

Figure 7:
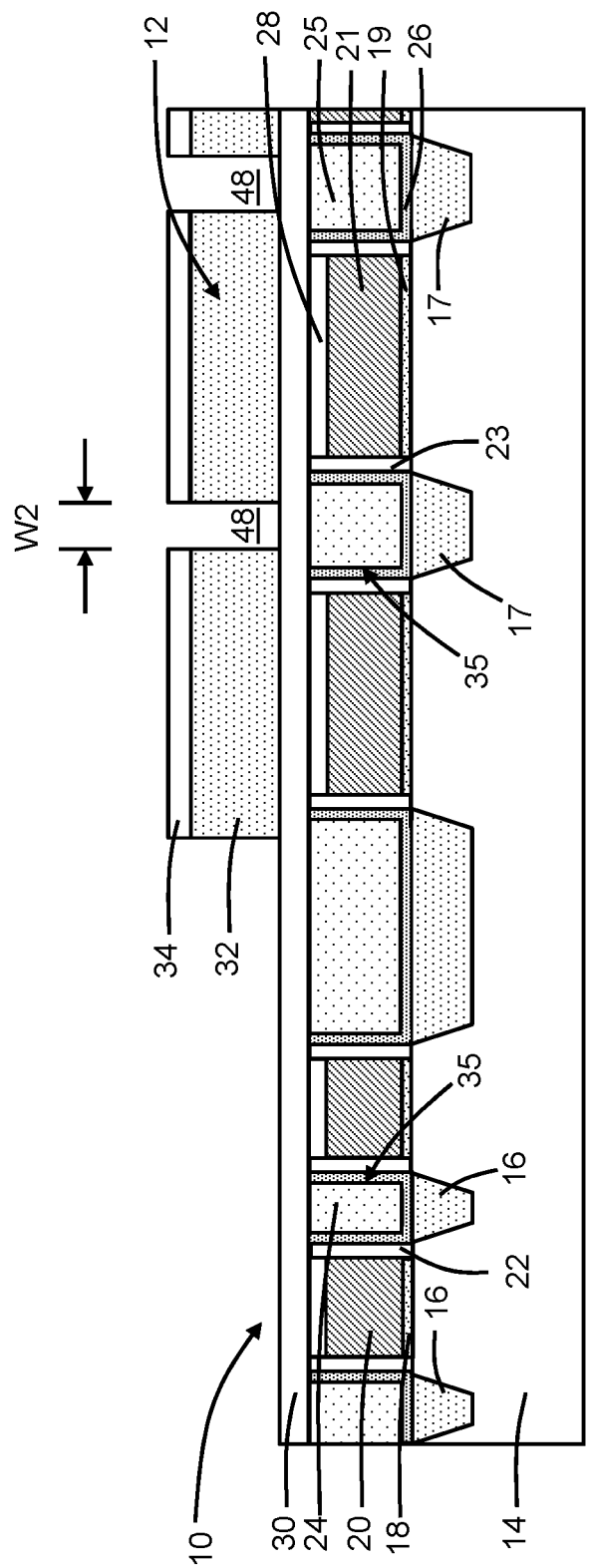

With reference to FIG. 7 in which like reference numerals refer to like features in FIG. 6 and at a subsequent fabrication stage, the pattern of openings 48 is then transferred from the dielectric layer 34 to the lower sacrificial layer 32 with an etching process, such as reactive ion etching. The etching process patterning the lower sacrificial layer 32 may thin the dielectric layer 30. The lower sacrificial layer 32 includes sections that are separated by the openings 48, which nominally have the width, W2.

Each of the openings 48 in the lower sacrificial layer 32 is arranged directly over one of the sections 25 of the interlayer dielectric layer 35. The width dimension, W2, of the openings 48 is preserved during the series of vertical transfers from the lithography stack to the lower sacrificial layer 32. The width dimension, W3, of sections 25 of the interlayer dielectric layer 35 is greater than the width dimension, W2, of the openings 48 in the lower sacrificial layer 32.

Figure 8:
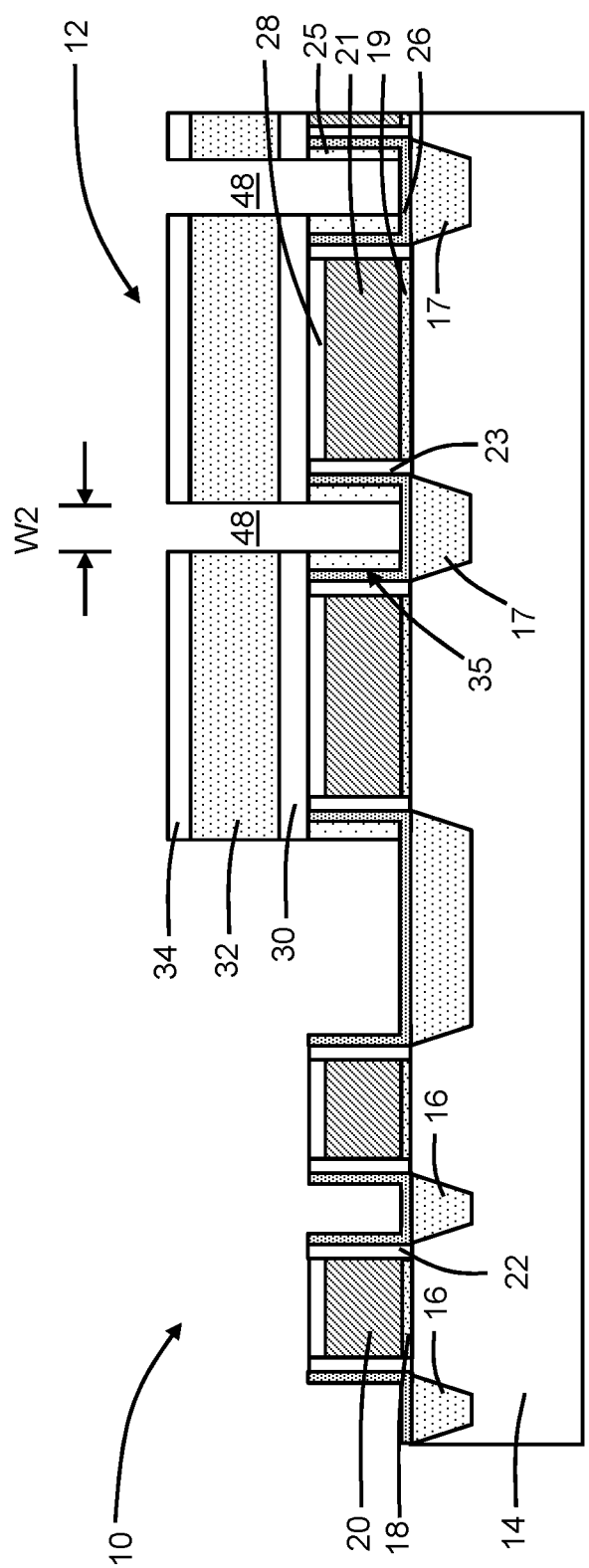

With reference to FIG. 8 in which like reference numerals refer to like features in FIG. 7 and at a subsequent fabrication stage, the openings 48 are extended with an anisotropic etching process, such as reactive ion etching, through the dielectric layer 30 and into the sections 25 of the interlayer dielectric layer 35 in the region including the field-effect transistor 12. In the region including the field-effect transistor 10, the sections 24 of the interlayer dielectric layer 35 are fully removed by the etching process in a self-aligned manner from their locations over the source/drain regions 16. The removal of the sections 24 of the interlayer dielectric layer 35 is self-aligned by the gate caps 28 and sidewall spacers 22 of the field-effect transistor 10, and may stop on the CESL 26 covering the source/drain regions 16, 17. A section of the upper sacrificial layer 36, which is preserved due to masking by the dielectric layer 37 (FIG. 1A) during its patterning, masks sections (not shown) of the interlayer dielectric layer 35 that are laterally adjacent to the sections 25 of the interlayer dielectric layer 35.

In contrast, the etching of the sections 25 of the interlayer dielectric layer 35 is not self-aligned. Instead, the sections 25 of the interlayer dielectric layer 35 are directly patterned during the anisotropic etching process. Portions of the sections 25 of the interlayer dielectric layer 35 are masked by overlying portions of the lower sacrificial layer 32 and dielectric layer 30 during the etching process. The openings 48 extend through the sections 25 of the interlayer dielectric layer 35 to the sections of the CESL 26 over the source/drain regions 17.

The width difference between the openings 48 and the sections 25 of the interlayer dielectric layer 35 provides the residual portions of the sections 25 of the interlayer dielectric layer 35 remaining over the source/drain regions 17. The anisotropic etching process removes the materials of the sections 24, 25 of the interlayer dielectric layer 35 and the dielectric layer 30 selective to the materials of the sidewall spacers 22, 23, the CESL 26, and the gate caps 28. In an embodiment, the anisotropic etching process may be selected to remove silicon dioxide selective to silicon nitride. The remainder of the dielectric layer 30 may be removed by the anisotropic etching process. The residual portions of the sections 25 of the interlayer dielectric layer 35 and the sidewall spacers 22, 23 have approximately equal heights.

Figure 9:
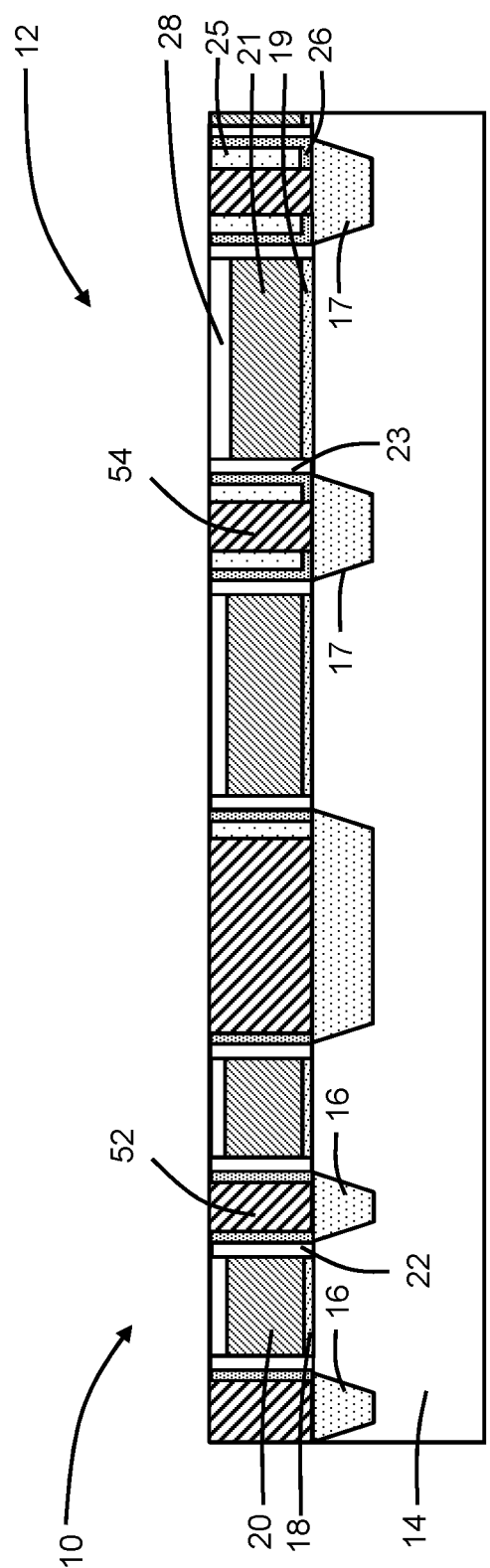

With reference to FIG. 9 in which like reference numerals refer to like features in FIG. 8 and at a subsequent fabrication stage, the lower sacrificial layer 32 is stripped and the CESL 26 is removed with an etching process from over the source/drain regions 16, 17. Contacts 52 are formed that are physically and electrically connected in direct contact with the source/drain regions 16, and contacts 54 are formed that are physically and electrically connected in direct contact with the source/drain regions 17. The contacts 52, 54 may contain a metal silicide, such as tungsten silicide, titanium silicide, nickel silicide, or cobalt silicide, and an optional metal fill, such as tungsten. The contacts 52, 54 may be deposited by, for example, chemical vapor deposition, in the openings 48 and planarized by chemical-mechanical polishing, and recessed with a selective etching process.

The residual portions of the sections 25 of the interlayer dielectric layer 35 are arranged between the contacts 54 and the CESL 26 and sidewall spacers 23 adjacent to the gate electrodes 21 of the field-effect transistor 12. In contrast, the contacts 52 are in direct contact with the CESL 26 covering the sidewall spacers 22 of the field-effect transistor 10 due to the full removal of the sections 24 of the interlayer dielectric layer 35.

Figure 10:
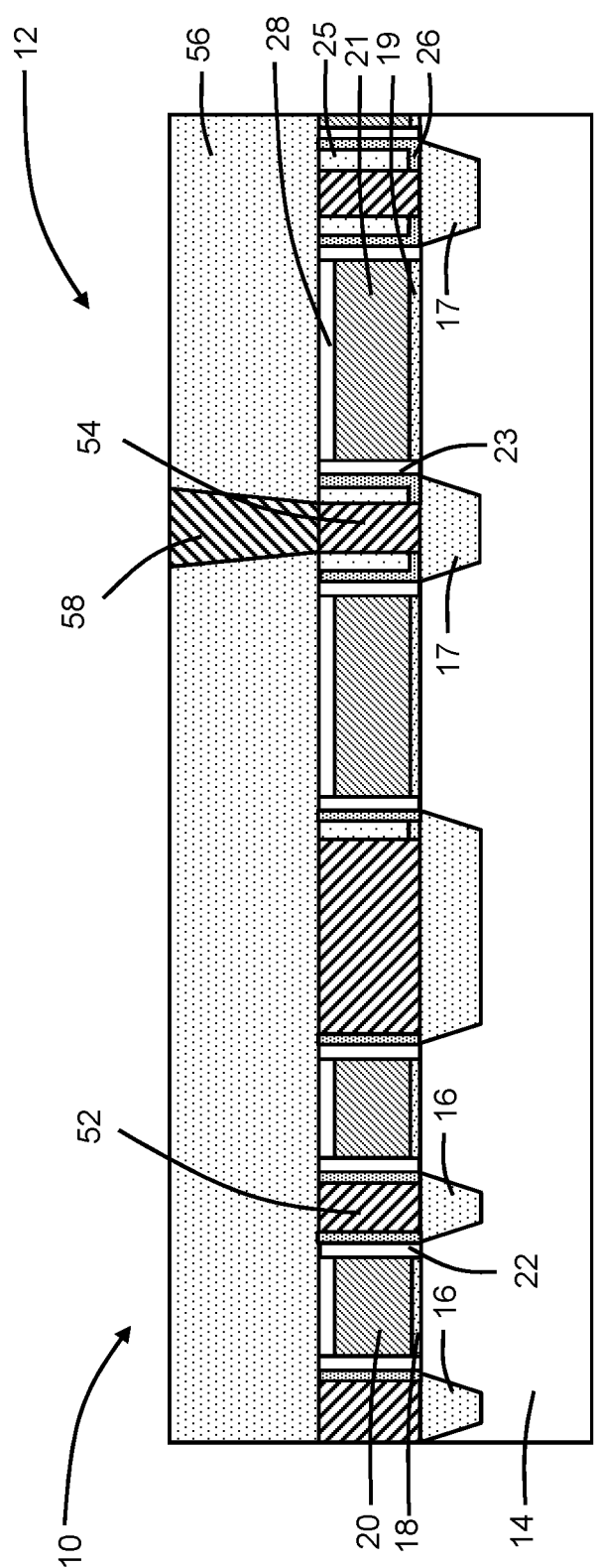

With reference to FIG. 10 in which like reference numerals refer to like features in FIG. 9 and at a subsequent fabrication stage, one or more dielectric layer 56 are formed over the field-effect transistors 10, 12 and contacts are formed, including a contact 58 extending in a vertical direction to at least one of the contacts 54. The contact 58, which may be in direct contact with the contact 54, is electrically and physically connected with the contact 54. The contact 58 may be formed from a different conductor (e.g., tungsten) than the contact 52. Contacts (not shown) are also formed that are connected with the gate electrodes 20, 21 and with the source/drain regions 16.

Figure 11:
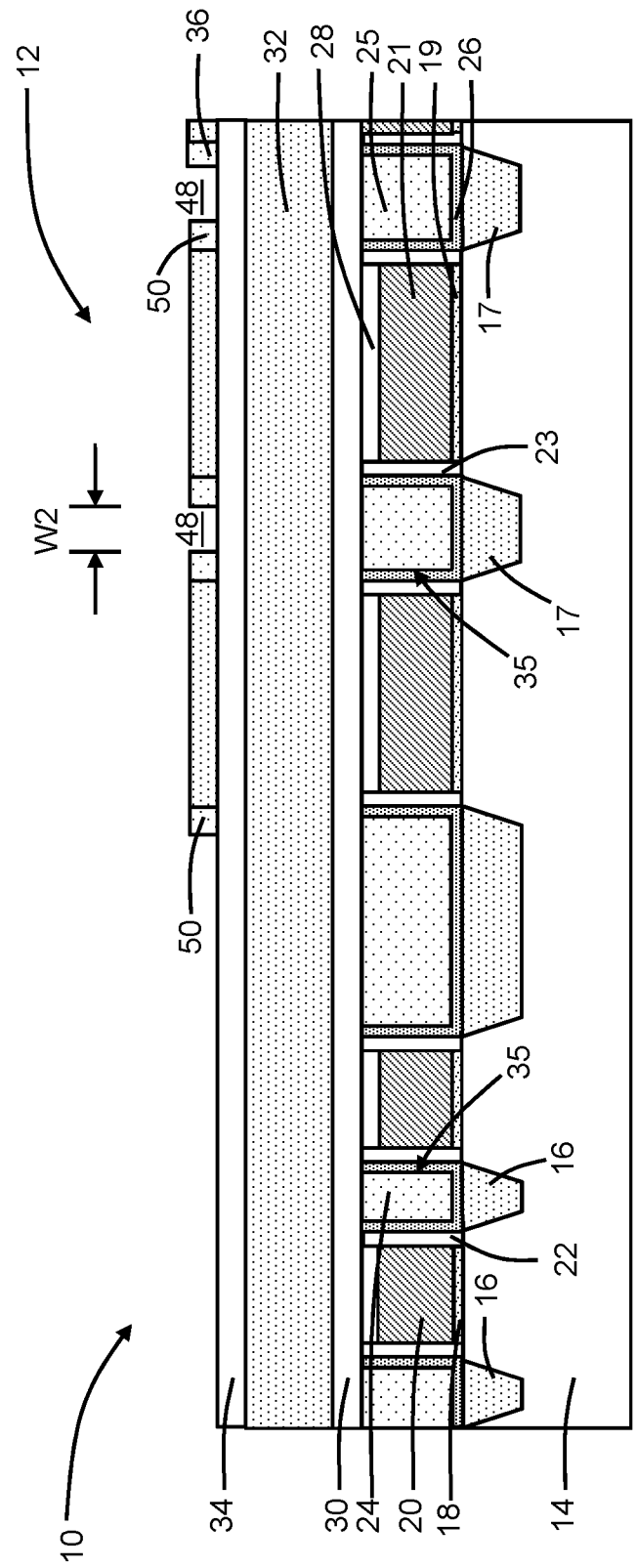
FIG. 11 is a cross-sectional view of a device structure in accordance with embodiments of the invention.

With reference to FIG. 11 in which like reference numerals refer to like features in FIG. 5 and in accordance with an alternative embodiment, the formation of the sidewall spacers 50 may be delayed until after the upper sacrificial layer 36 is patterned to introduce the openings 48. After the spin-on hardmask 38 is stripped, the sidewall spacers 50 are formed, as previously described, on the sidewalls of the sections of the patterned sacrificial layer 36. Prior to the formation of the sidewall spacers 50, the openings 48 between the sections of the upper sacrificial layer 36 have the width dimension, W1. After the formation of the sidewall spacers 50, the openings 48 between the sections of the upper sacrificial layer 36 have the width dimension, W2. In this alternative embodiment, the width of the openings 48 is narrowed later in the process flow. The sections of the patterned sacrificial layer 36 function as sacrificial mandrels for the deposition of the conformal layer 49 and the subsequent formation of the sidewall spacers 50. Processing continues as described in connection with FIGS. 6-10 with the sections of the upper sacrificial layer 36 and the sidewall spacers 50 collectively operating as an etch mask when patterning the dielectric layer 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first section of an interlayer dielectric layer over a first source/drain region of a first field-effect transistor;
    forming a second section of the interlayer dielectric layer over a second source/drain region of a second field-effect transistor;
    forming a first sacrificial layer over the first section and the second section of the interlayer dielectric layer;
    forming a second sacrificial layer over the first sacrificial layer;
    forming a first mandrel and a second mandrel on the second sacrificial layer, wherein the second mandrel is separated from the first mandrel by a gap that is arranged over the first section of the interlayer dielectric layer;
    forming a first sidewall spacer on the first mandrel and a second sidewall spacer on the second mandrel that narrow the gap;
    transferring a first pattern that includes the first mandrel, the second mandrel, the first sidewall spacer, and the second sidewall spacer to the second sacrificial layer with a first etching process such that the second sacrificial layer includes a first opening over the first section of the interlayer dielectric layer at a location of the gap;
    removing the first mandrel, the second mandrel, the first sidewall spacer, and the second sidewall spacer following the first etching process;
    transferring the first pattern from the second sacrificial layer to the first sacrificial layer with a second etching process such that the first sacrificial layer includes a second opening over the first section of the interlayer dielectric layer at a location of the first opening;
    etching the first section and the second section of the interlayer dielectric layer with a third etching process that transfers the first pattern from the first sacrificial layer to the first section of the interlayer dielectric layer and that fully removes the second section of the interlayer dielectric layer, wherein a third opening is formed in the first section of the interlayer dielectric layer at a location of the second opening in the first sacrificial layer;
    before forming the first mandrel and the second mandrel, patterning the second sacrificial layer with a fourth etching process to form a second pattern including a section of the second sacrificial layer and a trench arranged over a third section of the interlayer dielectric layer; and
    depositing a layer of image reversal material in the trench to form a third pattern that is complementary to the second pattern.

2. The method of claim 1 wherein the first sacrificial layer is comprised of amorphous carbon, and the second sacrificial layer is comprised of amorphous silicon.

3. The method of claim 1 further comprising:
    forming a first gate electrode of the first field-effect transistor; and forming a third sidewall spacer adjacent to a sidewall of the first gate electrode, wherein the first source/drain region is laterally adjacent to the third sidewall spacer, the first section of the interlayer dielectric layer is positioned over the first source/drain region, and the third opening extends through the first section of the interlayer dielectric layer to the first source/drain region.

4. The method of claim 3 further comprising:

forming a first contact arranged over the first source/drain region and laterally adjacent to the first sidewall spacer, wherein the first contact is coupled with the first source/drain region, and a portion of the first section of the interlayer dielectric layer is positioned between the first contact and the first sidewall spacer.

5. The method of claim 4 wherein the first contact is physically and electrically coupled in direct contact with the first source/drain region.

6. The method of claim 4 wherein the first sidewall spacer and the portion of the interlayer dielectric layer have approximately equal heights.

7. The method of claim 3 further comprising:

forming a second gate electrode of the second field-effect transistor;

forming a fourth sidewall spacer adjacent to a sidewall of the second gate electrode; and forming a second contact arranged over the second source/drain region and laterally adjacent to the fourth sidewall spacer, wherein the second section of the interlayer dielectric layer is fully removed from over the second source/drain region before forming the second contact.

8. The method of claim 1 wherein the first field-effect transistor is a long-channel field-effect transistor, and the second field-effect transistor is a short-channel field-effect transistor.

9. The method of claim 1 wherein forming the first mandrel and the second mandrel on the second sacrificial layer comprises:

applying a photoresist by a spin coating process; and patterning the photoresist to form a first resist shape providing the first mandrel and a second resist shape providing the second mandrel.

\* \* \* \* \*